(12) United States Patent
Gooding et al.

(10) Patent No.: US 7,337,103 B2
(45) Date of Patent: Feb. 26, 2008

(54) METHOD AND APPARATUS FOR THE AUTOMATIC CORRECTION OF FAULTY WIRES IN A LOGIC SIMULATION HARDWARE EMULATOR / ACCELERATOR

(75) Inventors: Thomas Michael Gooding, Rochester, MN (US); Roy Glenn Musselman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 10/757,788

(22) Filed: Jan. 15, 2004

(65) Prior Publication Data

US 2005/0171756 A1 Aug. 4, 2005

(51) Int. Cl.
 *G06F 9/455* (2006.01)
(52) U.S. Cl. .............................. 703/23; 703/14; 714/25
(58) Field of Classification Search ............ 703/23–28, 703/13, 14; 370/216–228, 352; 714/25–31
 See application file for complete search history.

(56) References Cited

U.S. PATENT DOCUMENTS

| 4,722,084 | A | * | 1/1988 | Morton | 714/3 |
| 5,229,990 | A | * | 7/1993 | Teraslinna | 370/218 |
| 5,361,249 | A | * | 11/1994 | Monastra et al. | 370/217 |
| 5,448,572 | A | * | 9/1995 | Knox et al. | 370/228 |
| 5,729,527 | A | * | 3/1998 | Gerstel et al. | 370/228 |
| 5,734,581 | A | * | 3/1998 | Butts et al. | 703/15 |
| 5,742,181 | A | * | 4/1998 | Rush | 326/41 |
| 5,958,063 | A | * | 9/1999 | Croslin et al. | 714/4 |
| 5,963,736 | A | * | 10/1999 | Sarno et al. | 703/27 |
| 6,928,403 | B2 | * | 8/2005 | Swoboda | 703/23 |
| 6,944,425 | B2 | * | 9/2005 | Fallenstein | 455/41.2 |
| 2001/0020224 | A1 | * | 9/2001 | Tomita | 703/23 |
| 2003/0095502 | A1 | * | 5/2003 | Glaser et al. | 370/228 |

OTHER PUBLICATIONS

Yu, Shu-Yi. "Fault Tolerance in Adaptive Real-Time Computing Systems." Doctoral Dissertation, Stanford University Dec. 2001.*
Babb, Jonathan et al. "Logic Emulation with Virtual Wires." IEEE Transactions on Computer-Aided Design of Integrated Circuits and Systems. vol. 16 No. 6, Jun. 1997.*
Tessier, Russel et al. "The Virtual Wires Emulation System: A Gate-Efficient ASIC Prototyping Environment." MIT Laboratory for Comuter Science 2001.*

* cited by examiner

*Primary Examiner*—Russell Frejd
(74) *Attorney, Agent, or Firm*—James R. Nock

(57) ABSTRACT

The present invention provides a method, apparatus and program-product for a self-healing, reconfigurable logic emulation system, wherein if a signal wire becomes faulty in an emulation cable during an emulation run, the runtime software can automatically reconfigure the emulator to reroute the data destined for the faulty signal wire across a spare wire. Such a feature enables a user to restart the emulation run without having to recompile the simulation model to account for the hardware fault.

16 Claims, 9 Drawing Sheets

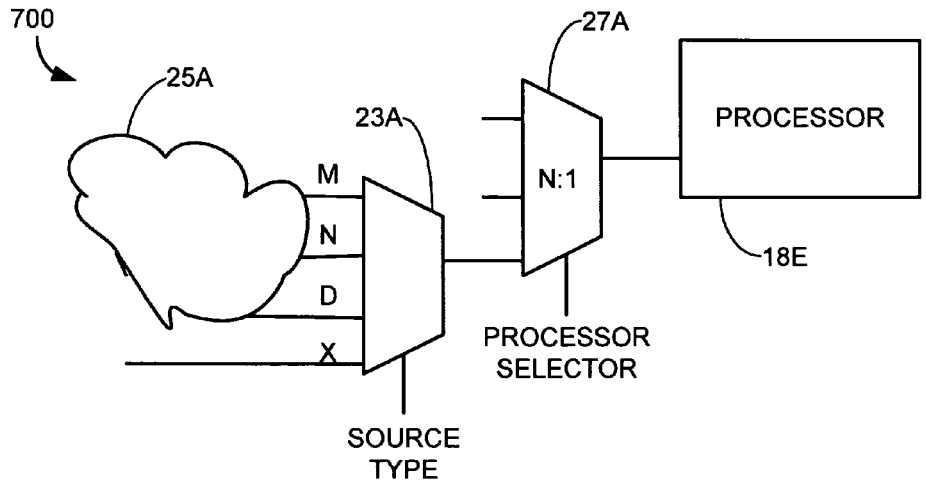

| Step | Source Type Sel | Proc Select | Change Proc Sel | New Proc Sel Value | Source Type Sel | Proc Select | Change Proc Sel | New Proc Sel Value |
|---|---|---|---|---|---|---|---|---|
| 0 | M | 0 | no | n/a | M | 13 | no | n/a |
| 1 | M | 1 | no | n/a | X | 1 | yes | 31 |
| 2 | M | 1 | no | n/a | X | 1 | yes | 31 |
| 3 | M | 0 | no | n/a | M | 0 | no | n/a |
| 4 | X | 23 | no | n/a | X | 3 | no | n/a |
| 5 | N | 1 | no | n/a | N | 1 | no | n/a |
| 6 | N | 20 | no | n/a | N | 2 | no | n/a |
| 7 | X | 1 | yes | 31 | X | 5 | no | n/a |
| 8 | X | 16 | no | n/a | X | 6 | no | n/a |
| 9 | M | 30 | no | n/a | N | 3 | no | n/a |
| 10 | X | 2 | no | n/a | X | 2 | no | n/a |
| 11 | X | 1 | yes | 31 | N | 1 | no | n/a |
| 12 | X | 0 | no | n/a | N | 0 | no | n/a |
| 13 | X | 0 | no | n/a | X | 1 | yes | 31 |
| 14 | N | 5 | no | n/a | N | 6 | no | n/a |
| 15 | X | 6 | no | n/a | X | 7 | no | n/a |
| 16 | M | 7 | no | n/a | M | 0 | no | n/a |

FIG. 7

METHOD AND APPARATUS FOR THE AUTOMATIC CORRECTION OF FAULTY WIRES IN A LOGIC SIMULATION HARDWARE EMULATOR / ACCELERATOR

FIELD OF THE INVENTION

The present invention relates generally to logic simulation hardware emulation, and more specifically to the automatic correction of faulty wires between configurable parallel switches in a logic simulation hardware emulator/accelerator.

BACKGROUND OF THE INVENTION

Design verification is essential to virtually any very large scale integration (VLSI) design project. One of the popular verification methods is logic simulation. Logic simulation software reports on how a circuit under design responds to a sequence of input vectors, so the designer can judge whether the circuit behaves as expected over the input sequence. The more vectors simulated, the greater confidence the designer has in the correctness of the designing circuit.

As circuit complexity increases and the time to market shortens, inadequate simulation speed becomes a major bottleneck in the design process. As a result, several special purpose machines have been built to simulate/emulate complex logic designs in hardware, rather than software. Such emulation/acceleration devices can provide several orders of magnitude of speed improvement during the simulation/emulation process. Thus, the necessity and usefulness of such devices has increased enormously with growth in the complexity of integrated circuits.

An emulation/acceleration engine operates to mimic the logical design of a set of one or more integrated circuit chips. The emulation of these chips in terms of their logical design is highly desirable for several reasons which are discussed in more detail below. It is, however, noted that the utilization of emulation/acceleration engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well mated to the utilization of emulation/acceleration engines which are electrically configured to duplicate the same logic function that is provided in a design automation tool.

Utilization of emulation/acceleration devices permits testing and verification, via actual electrical circuits, of logical designs before these designs are committed to a so-called "silicon foundry" for manufacture. The input to such foundries is the functional logic description required for the chip, and its output is initially a set of photolithographic masks which are then used in the manufacture of the desired electrical circuit chip devices. However, it is noted that the construction of such masks and the initial production of circuit chips, which operate in accordance with the designed-for functional logic requirements, is expensive. Any passage of a given device having the prescribed logic functionality though such a foundry is an expensive and time consuming process which clearly should be undertaken only once. It is the purpose of emulation/acceleration engines to ensure such a single passage from the functional logic design stage through the stage of chip production via such a foundry.

Verifying that logic designs are correct before committing a design to manufacturing, therefore, eliminates the need for costly and time-consuming multiple passes through a silicon foundry. Debugging logic errors deep inside a logic chip can be extremely difficult because of very limited observability. Emulation provides two very significant advantages. Firstly, the proper verification of a functional logic design eliminates the need for a second costly passage through the foundry, and, secondly, and just as importantly, getting the design "right the first time" means that the design does not have to be corrected in the foundry. Accordingly, production delays are significantly reduced and the time to market for the particular technology/technology improvements embedded in the integrated circuit chip is greatly reduced, thus positively impacting the ability to deliver the most sophisticated technological solutions to consumers in as short of time as possible.

An additional advantage that emulation/acceleration systems have is that they act as a functioning system of electrical circuits which makes possible the early validation of software which is meant to operate the system that the emulator/accelerator is mimicking. Thus, software can be designed, evaluated and tested well before the time when the system is embodied in actual circuit chips. Additionally, emulation/acceleration systems can also operate as simulator-accelerator devices thus providing a high speed simulation platform.

FIG. 1A illustrates a high-level block diagram of a typical emulation/acceleration system 10 (hereinafter referred to as emulation system 10), which is controlled by a host workstation 12. Emulation system 10 includes at least one emulation board 14, which, in turn, contains a plurality of emulation modules 16, as shown in FIG. 1B. Each emulation module 16 contains a plurality of emulation processors 18, as shown in FIG. 1C. Each emulation processor 18 is programmed to evaluate a particular logic function (for example, AND, OR, XOR, NOT, NOR, NAND, etc.). The programmed emulation processors 18, together as a connected unit, emulate the entire desired logic design under test 11 (i.e., the programmed emulation processors form part of a simulation "model" 15 for the logic design). This simulation model 15 may also include some additional controllability/observability logic to aid in the simulation/emulation process.

The overall simulation throughput of such a system is controlled by the interface between simulation model 15 running on the emulation system 10 and a runtime control program 20 running on a host workstation 12. Control program 20 interfaces with emulation board 14 via a control card 27. Transactions between runtime control program 20 and the emulation board 14 include reading and writing the values of logic facilities contained within the simulation model and the execution of cycles to recalculate the model state by toggling the value of clock signals that propagate to latch facilities within simulation model 15.

FIG. 2 illustrates a representative configuration of an emulation system 10. In the illustrated configuration, a plurality of emulation boards 14A-14H (eight illustrated, but sixteen is also typical), known hereafter collectively as 14, are connected by a plurality of emulation cables 19 (potentially hundreds). Each emulation cable 19 contains a plurality signal wires (e.g., 33 wires in each direction), as shown at cross sectional view 17 of emulation cable 19. In such an emulation system, the primary hardware reliability problem encountered is that oftentimes one signal wire in an emulation cable 19 becomes disconnected or becomes functionally intermittent, given the extremely large number of signal wires in the emulation system. When this occurs, the users of the emulation system 10 have to terminate the currently running emulation, and recompile their models to match the new system configuration (i.e., the newly discovered bad wire has to be removed from the available configuration), before re-starting the emulation run. This creates a substantial problem because recompiling these models can take over eight hours per model, and this time will likely increase substantially as the model sizes increase in the future.

Also, there have been several occasions in which a particular user problem was associated with a particular user model—and rebuilding the model resulted in a different behavior. If the emulation hardware experienced a fault while debugging the problem, this failing testcase is lost. In this instance, debugging activities cannot continue since the only example of the problem has been lost in the recompile.

There is a need for a self-healing, reconfigurable logic emulation system, wherein if a signal wire becomes faulty in an emulation cable during an emulation run, the runtime software can automatically reconfigure the emulator to reroute the data destined for the faulty signal wire across a spare wire. Such a feature enables a user to restart an emulation run without having to recompile the model to account for the hardware fault.

SUMMARY OF THE INVENTION

The present invention provides a method, apparatus and program-product for a self-healing, reconfigurable logic emulation system, wherein if a signal wire becomes faulty in an emulation cable during an emulation run, the runtime software can automatically reconfigure the emulator to reroute the data destined for the faulty signal wire across a spare wire. Such a feature enables a user to restart the emulation run without having to recompile the model to account for the hardware fault.

In one embodiment of the present invention, the present invention provides a logic simulation hardware emulator having a simulation model and a runtime program for controlling the simulation model. The simulation model includes one or more source emulation processors coupled to one or more receiving emulation processors by an emulation cable having a plurality of signal wires. This plurality of signal wires includes a plurality of regular signal wires and one or more spare signal wires. Upon detection of a fault on a regular signal wire, the runtime control program reassigns a signal on the regular signal wire having the fault to the one or more spare signal wires.

In an embodiment of the present invention, the spare signal wires are defined at simulation model build time, and are defined by designating one or more emulation processors and their corresponding regular signal wires as faulty during simulation model build.

In one embodiment, the logic simulation hardware emulator includes a spare select multiplexer, the inputs of the spare select multiplexer being coupled to the outputs of the one or more emulation processors. The output of the spare select multiplexer is coupled to the input of the emulation cable. In this embodiment, the spare select multiplexer multiplexes the signal on the regular signal wire having the fault through the one more spare signal wires. In one embodiment, the signal select for the spare select multiplexer is provided by a spare select register, which is updated by the runtime control program during the simulation run.

In one embodiment, the logic simulation hardware emulator includes one or more source type multiplexers coupled to the output of the emulation cable, where each of the source type multiplexers has a select signal. The logic simulation hardware emulator also includes a plurality of processor selector multiplexers coupled to the outputs of the source type multiplexers. Each of the output of the processor selector multiplexers is coupled to the input of one or more receiving emulation processors, where each of the processor selector multiplexers has a select signal. In one embodiment, the select signals for the source type multiplexer and the processor selector multiplexer are provided by the runtime control program.

The present invention also provides a method for the automatic reconfiguration of faulty signal wires in a logic simulation hardware emulator. The logic simulation hardware emulator has one or more source emulation processors coupled to one or more receiving emulation processors by a set of emulation cables having a plurality of signal wires. The plurality of signal wires includes a plurality of regular signal wires and one or more predefined spare signal wires. The method begins by identifying a set of faulty signals wires within the plurality of regular signal wires, if any faulty signal wires exist. Next, the method reassigns signals from the set of faulty signal wires to the one or more spare signal wires within the set of emulation cables.

In one embodiment of the present invention, the method further includes the step of performing a connectivity diagnostic on the set of emulation cables within the hardware emulator. In another embodiment of the present invention, the method further includes the step of predefining one or more spare signal wires within the emulation cables at simulation model build time.

In one embodiment of the present invention, the step of reassigning signals from the set of faulty signal wires to one or more spare signal wires within the set of emulation cables includes the steps of: 1) determining if a spare signal wire is available, if one or more faulty signal wires exist; and 2) setting a source module spare register to a value corresponding to the source emulation processor having the faulty wire; and 3) changing any receiving emulation processor steps sourced by the faulty wire to the spare wire.

The present invention provides several key advantages over current emulation systems. The present invention allows a user to keep running with existing simulation models without having to spend extensive time (i.e., several hours) rebuilding the model with an updated configuration. Also, models can be built once and have a longer useful life. Model performance (i.e., cycles per second) is unaffected when a reroute is used, and no user intervention is required to perform the reroute. Additionally, impact to the chip architecture is minimal (e.g., one additional multiplexer and one additional register per module). Further, since the spare select register value does not change during the course of the emulation cycle, the timing delay through the new multiplexer is predictable. Finally, the present invention effectively allows the hardware emulator to be self-healing with respect to wire faults.

The foregoing and other features and advantages of the invention will be apparent from the following more particular description of preferred embodiments of the invention, as illustrated in the accompanying drawings.

BRIEF DESCRIPTION OF THE DRAWINGS

FIG. 7 illustrates a simplified logic diagram and output table illustrating a sample model run in accordance with the present invention.

DETAILED DESCRIPTION OF THE PREFERRED EMBODIMENTS

Figure 1A:
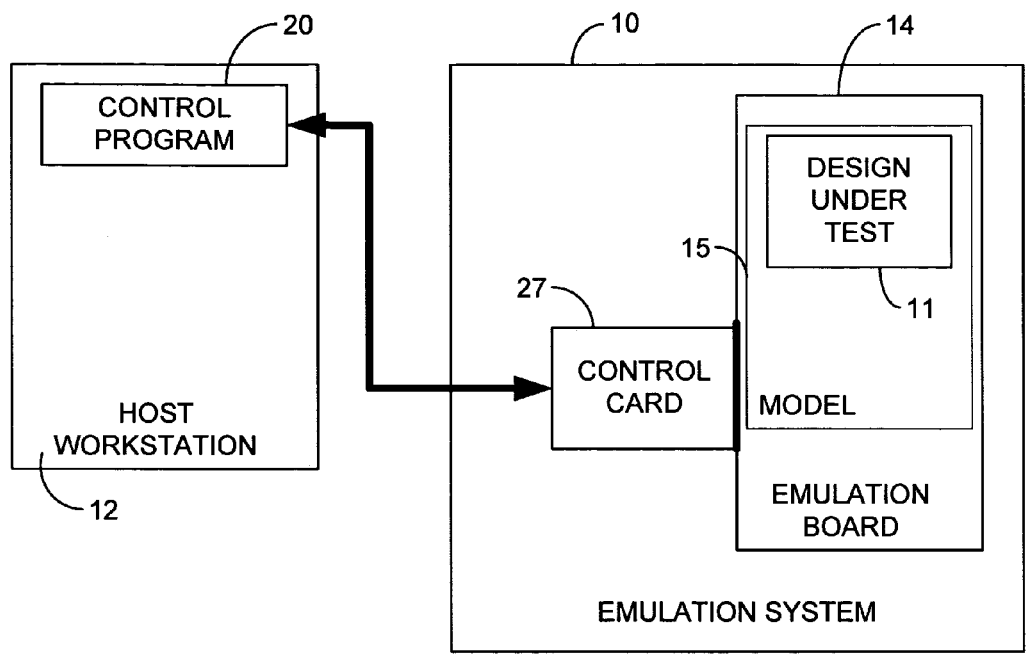
FIG. 1A (Prior Art) is a high-level block diagram of a typical logic emulation system controlled by a host workstation.
Figure 1B:
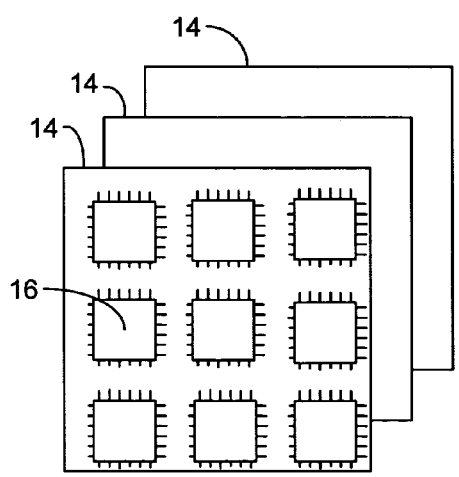
FIG. 1B (Prior Art) is a representation of an emulation board from the logic emulation system of FIG. 1A where the emulation board contains a plurality of emulation modules.
Figure 1C:
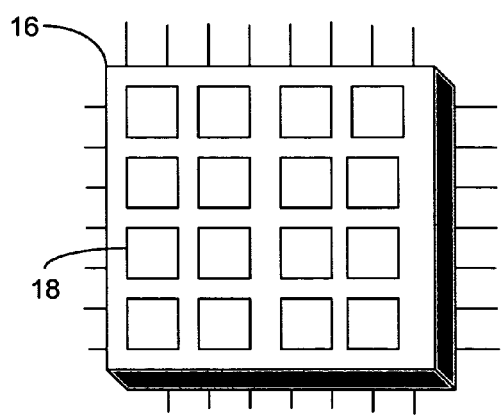
FIG. 1C (Prior Art) is a close-up view of an emulation module, previously illustrated in FIG. 1B, wherein the emulation module contains a plurality of emulation processors.
Figure 2:
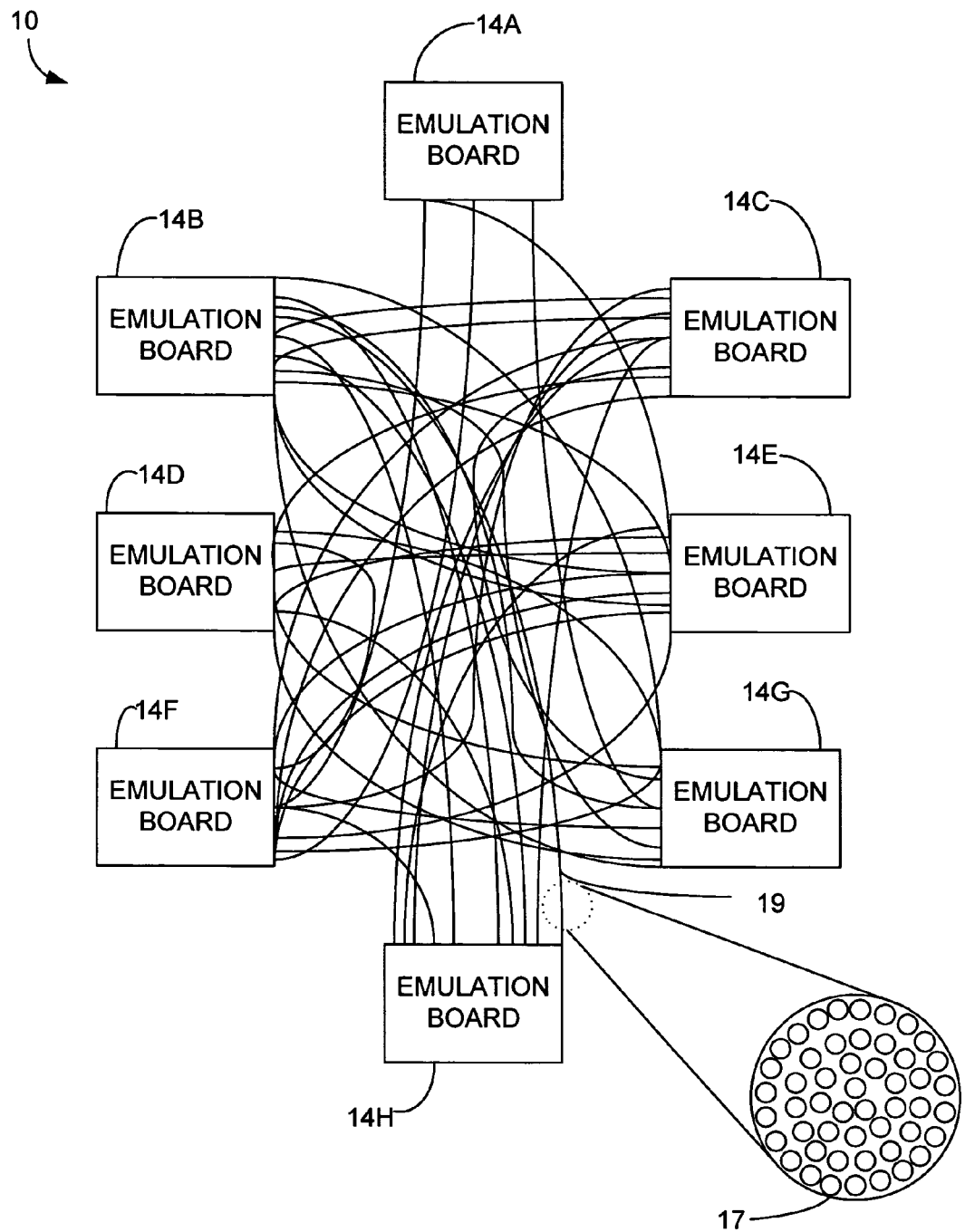
FIG. 2 (Prior Art) illustrates a representative configuration of an emulation system in accordance with the present invention.
Figure 3:
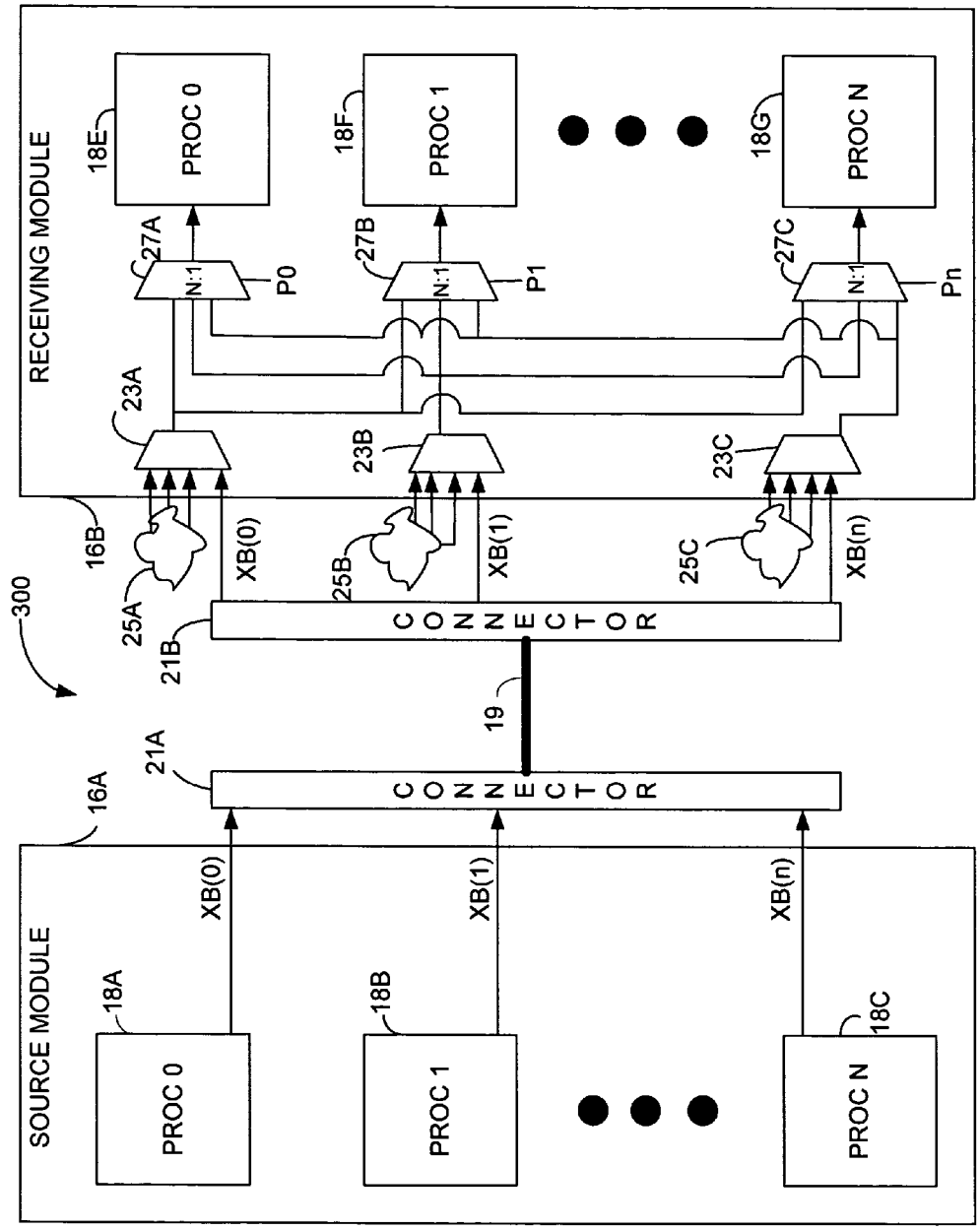
FIG. 3 (Prior Art) is a block diagram illustrating an abstracted view of the cable connectivity in an emulation architecture.

Turning to the Drawings, wherein like numbers denote like parts throughout the several views, FIG. 3 is a prior art block diagram illustrating an abstracted view of the cable connectivity in an emulation architecture, shown generally at 300. In the illustrated embodiment, a source emulation module 16A is connected to a receiving emulation module 16B via an emulation cable 19. Each emulation processor 18A-18C on the source emulation module 16A has one output that is directly connected to one source signal wire (XB(0), XB(1), and XB(n)), respectively. These source signal wires are coupled to a first end of the emulation cable 19 via an emulation cable connector 21A. The second end of the emulation cable 19 is connected to a second emulation cable connector 21B, which serves to couple the source signal wires from the source emulation module 16A to corresponding receiving signal wires on the receiving emulation module 16B. Each of the receiving signal wires (XB(0), XB(1), and XB(n)), respectively, are then coupled to a corresponding source type multiplexer 23A-23C within the receiving emulation module 16B. A plurality of signals from other types of routing resources 25A-25C (e.g., inter-board, intra-board, inter-module and intra-module connections) are also coupled to the inputs of each of the source type multiplexers 23A-23C.

The output from each of the source type multiplexers 23A-23C is then coupled to an input on each of the processor selector multiplexers 27A-27C within the receiving emulation module 16B. Processor selector multiplexer determines which of the receiving signal wires (XB(0), XB(1), and XB(n)), respectively, is routed to which of the emulation processors 18E-18G on the receiving emulation module 16B. A processor select signal (P0, P1, and Pn) selects which of the processor selector multiplexer inputs is passed along to emulation processors 18E-18G.

Figure 4:
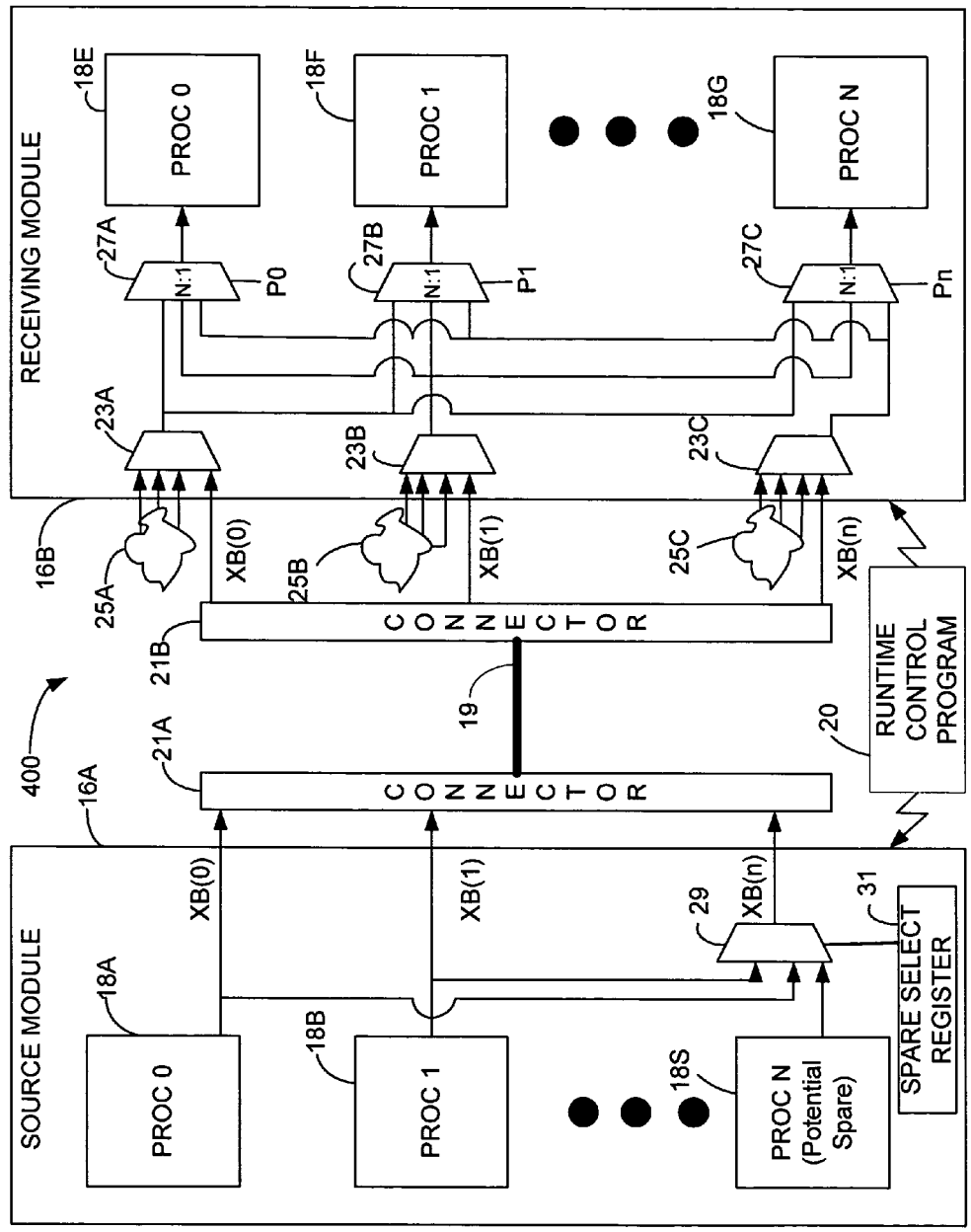
FIG. 4 is a block diagram illustrating an abstracted view of a current emulation architecture modified to accommodate the automatic correction of faulty wires feature of the present invention.

FIG. 4 is a block diagram illustrating an abstracted view of a current emulation architecture modified to accommodate the automatic correction of faulty wires feature of the present invention, shown generally at 400. In a preferred embodiment of the present invention, a plurality of signal wires within the emulation cable are designated as "regular" signal wires. Also, one or more signal wires within the emulation cable are reserved as "spare" signal wires, these spare signal wires being defined when the users build their simulation models. Thus, if a wire within any emulation cable 19 becomes faulty, the runtime software of the emulation system can automatically reconfigure the emulator to reroute the data destined for the broken wire (i.e., the regular signal wire) across the spare wire. In subsequent illustrated embodiments, the redirection of only one faulty signal wire is shown. However, the redirection of multiple faulty signal wires is contemplated by the present invention, and clearly falls within the spirit and scope of the present invention.

Currently, the runtime software can detect which wire is bad by sending patterns on the cables. But, existing implementations merely display a message indicating that a faulty wire exists and instructs the user to manually rebuild the model, resulting in hours (if not days) of downtime. The present invention offers a significant enhancement in that the runtime software now provides an automatic "patch" to the existing model, and enables the user to restart the current simulation job without having to recompile the simulation model.

In order to accomplish the automatic reroute described above, a spare select multiplexer 29 is added to the source emulation module 16A. The inputs of the spare select multiplexer 29 are provided by the outputs of all other processors 18A, 18B, and 18S on the source emulation module 16A. A spare select register 31 coupled to the spare select multiplexer 29 provides the select signal to the spare select multiplexer. The output from the spare select multiplexer 29 is then coupled to the emulation cable connector 21A, and ultimately, the emulation cable 19.

During the simulation run, the runtime control program 20 writes new values into the spare select register 31 when a fault occurs within a regular signal wire on the emulation cable 19. Runtime control program 20 also modifies processor steps within receiving emulation module 16B to change the value from the index of the faulty regular signal wire to the spare signal wire. More specifically, runtime control program 20 controls the select signals for the source type multiplexers 23A-23C and the processor selector multiplexers 27A-27C such that the signal is routed from the spare signal wire to the appropriate receiving emulation module(s) 16A-16C. An example of this is shown in detail in FIG. 7, described below.

When building a model, one input to the build software is a description of the hardware and its defects. For example, if a wire is bad, the build software will not assign anything to that particular resource. Thus, in order to designate spare wires for use with the present invention, one or more signal wires/processors within the current configuration are designated as "bad", and the altered configuration is passed to the model build software. In this way, the complier is "tricked"

into believing that the "spare wire" is defective. This step is required to insure that no communication is scheduled on the designated spare wire.

Figure 5:
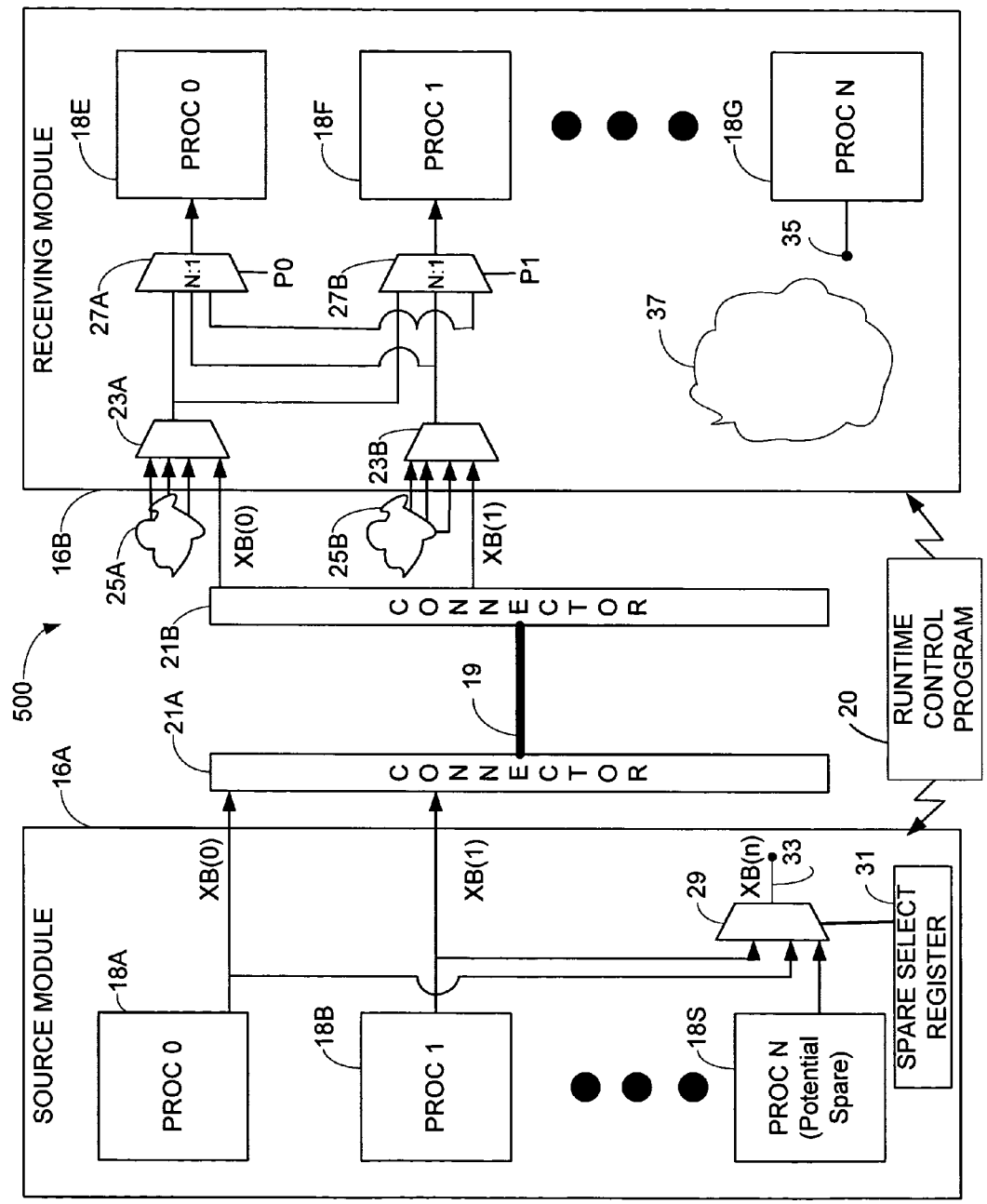
FIG. 5 is a block diagram illustrating an abstracted view of a current emulation architecture incorporating the present invention, wherein the spare wires are removed from the configuration.

FIG. 5 is a block diagram illustrating an abstracted view of a current emulation architecture incorporating the present invention, as previously illustrated in FIG. 4, wherein the spare wires are logically removed from the configuration, shown generally at 500. In this example, the XB(n) signal originating out of the spare emulation processor 18S is designated as "bad" to the model compiler, since it is to be designated as a "spare" signal. As a result, the XB(n) signal is essentially removed from the configuration of both the emulation source module 16A and the emulation receiving module 16B (note the signal tie-offs 33 and 35, and the logic "removed" by the model compiler, shown at 37).

In order to accomplish the reroute step after detecting a fault in the emulation cable 19, the runtime control program 20 writes a new value into the spare select register 31. Also, each processor step that requires modification on the emulation receiving modules is modified by the runtime control program 20 to change the value from the index of the bad wire to the index of the spare wire (i.e., the processor selector signal is set to select the "spare" signal, wherever appropriate). Since the processor input is multiplexed by other routing paths (e.g., intra-module wiring), only the external "XB" source type will be modified.

Figure 6:
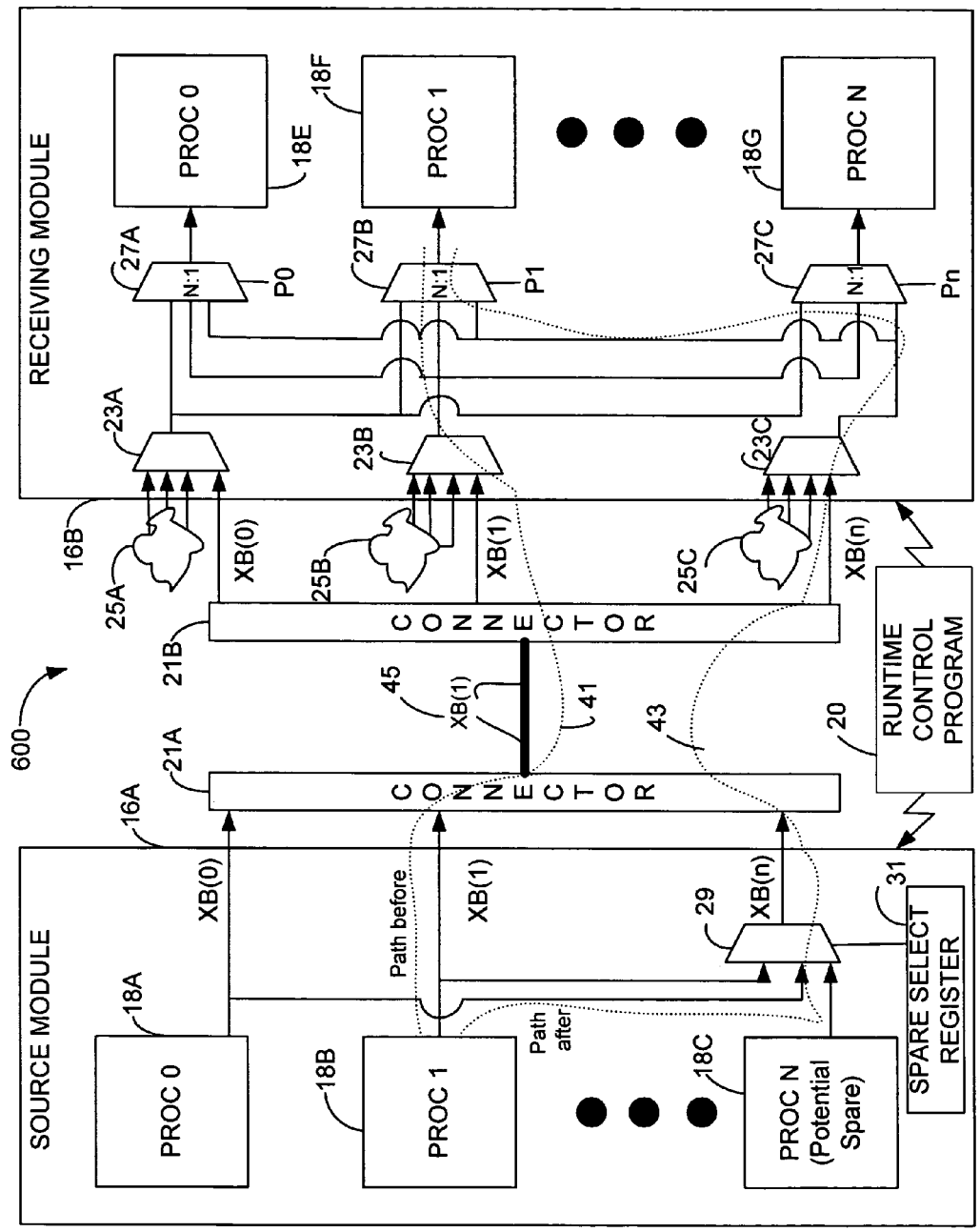
FIG. 6 is a block diagram illustrating an abstracted view of a current emulation architecture incorporating the present invention, showing the logic paths before and after the spare wire substitution occurs.

FIG. 6 is a block diagram illustrating an abstracted view of a current emulation architecture incorporating the present invention, showing the logic paths before and after the spare wire substitution occurs, shown generally at 700. More specifically, FIG. 6 is an illustrative example of how a spare wire would be used, at runtime, to bypass a bad connection in wire XB(1).

The path through the emulation system before the wire breakage occurs is shown generally at 41. In this instance the XB(1) source signal wire from emulation processor 18B is coupled to emulation cable 19 via emulation cable connector 21A. At the opposite end of emulation cable 19, the XB(1) receiving signal wire is routed from emulation cable connector 21B to the input of source type multiplexer 23B. The output of source type multiplexer 23B, is then coupled to the input of processor selector multiplexer 27B. Finally, the signal reaches receiving emulation processor 18F.

In the illustrated scenario, a wire breakage occurs in emulation cable 19 on signal wire XB(1), as shown at 45. This breakage is detected via means described earlier, and a new path though the emulation system now occurs, as shown generally at 43. In this instance, the output from source emulation processor 18B is also tied to an input of spare select multiplexer 29.

After the breakage is detected, the runtime control program 20 changes the value of spare select register 31 to now select the output of emulation processor 18B. The selected signal then passes from spare select multiplexer 29 through emulation cable 19, via emulation cable connectors 21A and 21B, to the input of source type multiplexer 23C. The runtime control program 20 selects the "X" input via a source type select signal, and the selected signal then passes to the input of processor selector multiplexer 27B. The runtime control program 20 sets the processor selector multiplexer signal P1 to select the input from the potential spare processor 18S (i.e., the XB(n) wire), and the selected signal finally reaches emulation processor 18F. Thus, in the receiving emulation module 16B, for each step that uses XB(1), the multiplexer values for those steps will be changed to the multiplexer value corresponding to the spare, "n". In the illustrated example, the output from emulation processor 18B is transmitted on both XB(1) and XB(n). But since all the receivers that were listening to XB(1) previously are now tied to XB(n) by the runtime software, only the XB(n) signal is used.

FIG. 7 illustrates a simplified logic diagram 700 and output table 710 illustrating a sample model run in accordance with the present invention. More specifically, this is an example of the bits the runtime software must modify to use a wire designated as "spare". In the illustrated example, the spare register is set to "1" in the source module. The output table illustrates values within the receiving module (i.e., target module). In this example, the model runs in 16 steps. XB(1) was found at runtime to be faulty. Emulation processor "31" was designated as the spare during the model compilation/build process. The illustrated example only shows the changes to the first two processors. The same type of change would apply to the other processors on the receiving chip as well.

Figure 8A:
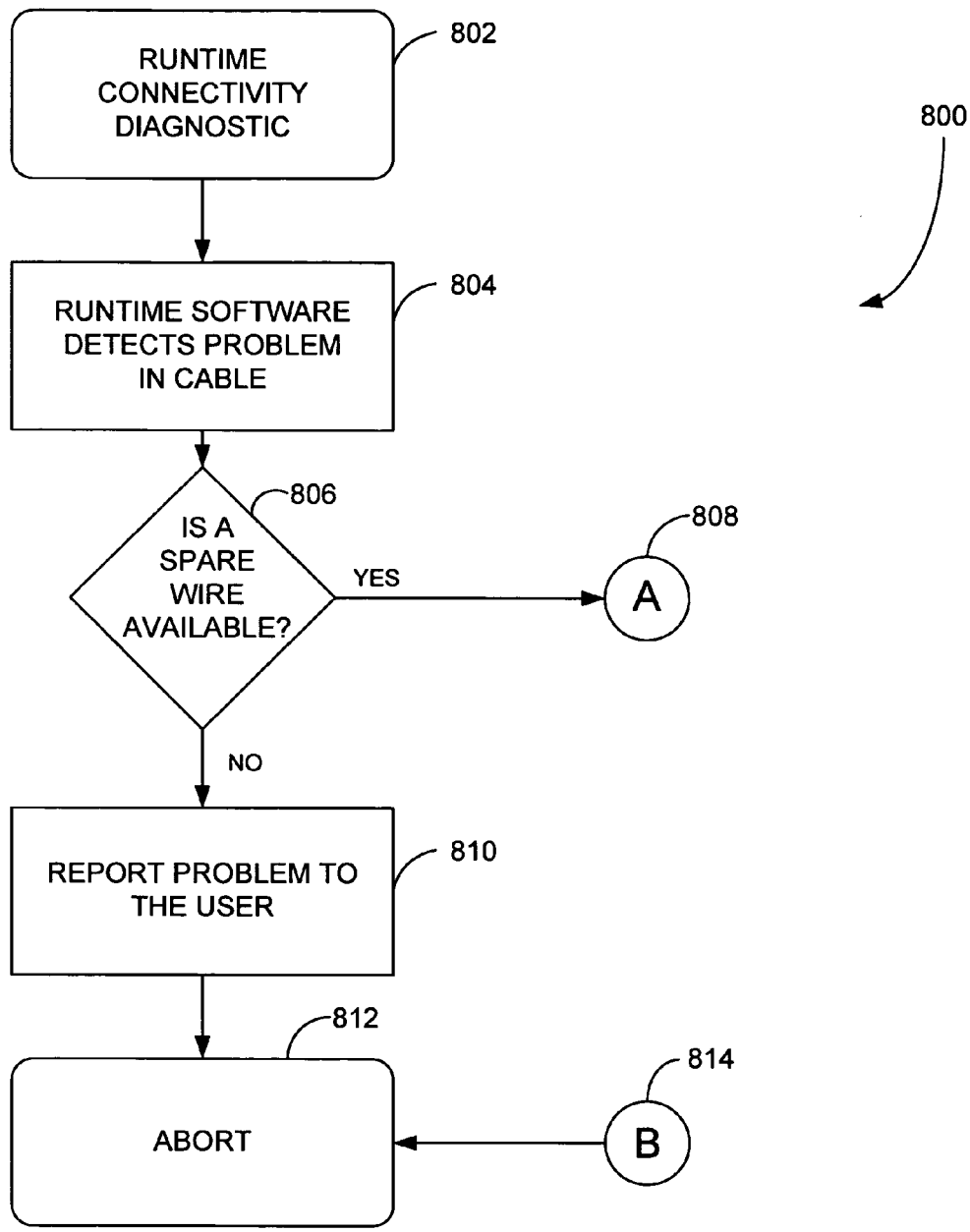
FIGS. 8A and 8B collectively illustrate a flow diagram describing the steps that occur when a problem is detected in a signal wire within the emulation system.
Figure 8B:
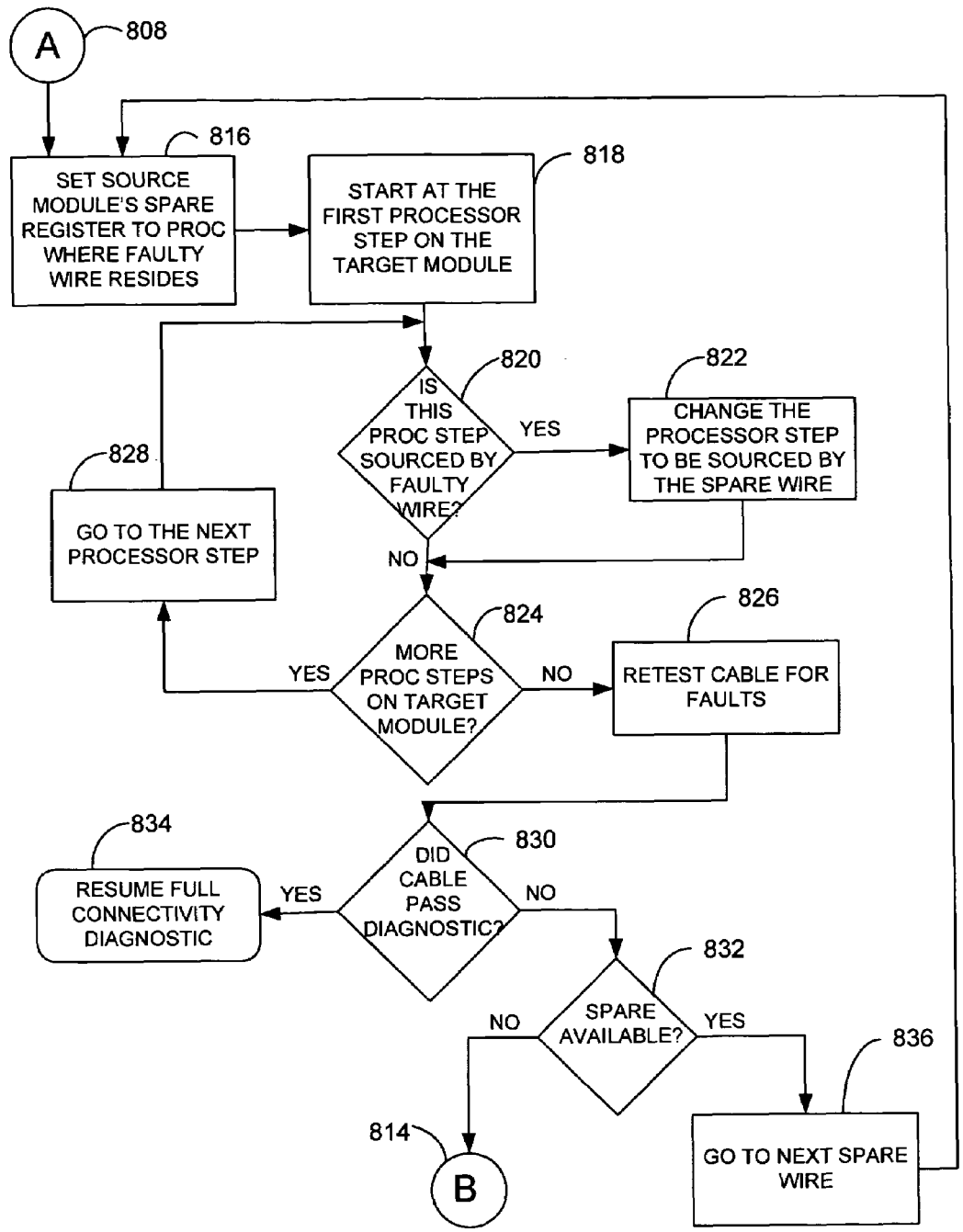

FIGS. 8A and 8B collectively illustrate a flow diagram that describes the steps that occur when a problem is detected on a signal wire within emulation cable 19, shown generally at 800. At block 802, the runtime software controlling the emulation process is started (e.g., the runtime connectivity diagnostic). At block 804, the runtime software detects a problem with one or more signal wires within the emulation cable. At block 806, it is determined if a spare wire is available within the emulation system. If not, control passes to block 810, where the problem is reported to the user, and the method aborts at block 812. If a spare wire is available, control passes to block 816 via connector 808, where the source emulation module's spare select register is set to correspond to the emulation processor with the faulty wire.

Control then passes to block 818, where the first processor step on the receiving emulation module (i.e., target module) is performed. At block 820, it is determined if the current processor-step is sourced by the faulty wire. If so, control passes to block 822, where the processor step is changed to now be sourced by the spare signal wire. At block 824, it is determined if there are more processor steps to be performed on the receiving emulation module. If so, control passes to block 826, where the runtime control program steps to the next processor step, and control passes back to block 820. If there are no further processor steps to be performed on the receiving emulation module, control passes to block 826, where the emulation cable is once again tested for faults. At block 830, it is determined if the emulation cable passed the diagnostic. If so, control passes to block 834 where the full connectivity diagnostic is resumed. If not, control passes to block 832, where it is determined if a spare wire is currently available. If not, control passes to block 812 via connector 814, where the routine aborts. If a spare wire is available, control passes to 836 where the spare is made available, then control passes back to block 816.

At this point, it is important to note that while the present invention has been and will continue to be described in the context of a fully functional hardware emulator (i.e., computer system), those skilled in the art will appreciate that the present invention is capable of being distributed as a program product in a variety of forms, and that the present invention applies equally regardless of the particular type of computer readable signal bearing media used to actually carry out the distribution. Examples of suitable signal bearing media include: recordable type media such as floppy drives and CD RW, and transmission type media such as digital and analog communications links. It is further contemplated that runtime control program 20 may also be implemented in hardware/firmware and still fall within the scope and spirit of the present invention.

The invention in its broader aspects is therefore not limited to the specific details, representative apparatus and method, and illustrative examples shown and described. Accordingly, departures may be made from such details without departing from the spirit or scope of applicants' general inventive concept. It is intended that the scope of the present invention be limited not by this detailed description, but rather by the claims appended hereto. Therefore, the invention lies in the claims hereinafter appended.

The invention claimed is:

1. An apparatus, comprising:
   an emulation system, comprising:
      at least one emulation board comprising a plurality of emulation processors, the emulation processors comprising at least one source emulator processor and at least one receiving emulation processor coupled together by a plurality of emulation cables, wherein each emulation cable includes a plurality of signal wires, each signal wire comprising a plurality of regular signal wires and one or more spare signal wires; and
      a simulation model mapped onto the source emulation processors and the receiving emulation processors;
   a host workstation comprising a runtime control program for controlling the simulation model, wherein upon detection of a fault on one of the regular signal wires, the runtime control program reassigns the signal on the regular signal wire having the fault to one of the one or more spare signal wires; and
   an interface cable coupling the emulation system to the host workstation.

2. The apparatus of claim 1, wherein the one or more spare signal wires are defined at simulation model build time.

3. The apparatus of claim 1, wherein the one or more spare signal wires are defined by designating one or more of the plurality of emulation processors and their corresponding regular signal wires as faulty during simulation model build.

4. The apparatus of claim 1, wherein the apparatus further comprises a spare select multiplexer, the inputs of the spare select multiplexer coupled to the outputs of the one or more source emulation processors, and output of the spare select multiplexer coupled to the input of the emulation cable, wherein the spare select multiplexer multiplexes the signal on the regular signal wire having the fault through the one or more spare signal wires.

5. The apparatus of claim 4, wherein a signal select for the spare select multiplexer is provided by a spare select register.

6. The apparatus of claim 5, wherein the spare select register is updated by the runtime control program during the simulation run.

7. The apparatus of claim 1, wherein the simulation hardware emulator further comprises:
   one or more source type multiplexers coupled to an output of the emulation cable, wherein each of the one or more source type multiplexers has a select signal; and
   a plurality of processor selector multiplexers coupled to the outputs of the one or more source type multiplexers, wherein the output of each of the plurality of processor selector multiplexers is coupled to an input of one or more of the at least one receiving emulation processors, and wherein each of the plurality of processor selector multiplexers has a select signal.

8. The apparatus of claim 7, wherein the select signals for the one or more source type multiplexers and the plurality of processor selector multiplexers are provided by the runtime control program.

9. A method for the automatic reconfiguration of faulty signal wires in an emulation system, the emulation system having one or more source emulation processors coupled to one or more receiving emulation processors by a set of emulation cables, each emulation cable having a plurality of signal wires; the plurality of signal wires comprising a plurality of regular signal wires and one or more predefined spare signal wires, the method comprising the steps of:
   detecting a fault on one or more of the plurality of signal wires within the emulation system via a runtime control program residing on a host workstation externally coupled to the emulation system; and
   reconfiguring the emulation system via the runtime control program, wherein any of the signal wires having a fault are reassigned to one or more predefined spare signal wires.

10. The method of claim 9, wherein the method further includes the step of:
    performing a connectivity diagnostic on the set of emulation cables within the hardware emulator.

11. The method of claim 9, wherein the method further includes the step of:
    predefining one or more spare signal wires within the emulation cables at simulation model build time.

12. The method of claim 9, wherein the step of reassigning signals from the set of faulty signal wires to one or more predefined spare signal wires within the set of emulation cables includes the steps of:
    determining if a spare signal wire is available, if one or more faulty signal wires exist;
    setting a source module spare register to a value corresponding to the source emulation processor having the faulty wire; and
    changing any receiving emulation processor steps sourced by the faulty wire to the spare wire.

13. A computer-readable program stored on a tangible, recordable-type computer-readable medium, the computer readable program providing the automatic reconfiguration of faulty signal wires in an emulation system the emulation system having one or more source emulation processors coupled to one or more receiving emulation processors by a set of emulation cables, each emulation cable having a plurality of signal wires; the plurality of signal wires comprising a plurality of regular signal wires and one or more predefined spare signal wires, the computer readable program causing the computer to execute the steps of:
    detecting a fault on one or more of the plurality of regular signal wires within the emulation system via a runtime control program residing on a host workstation externally coupled to the emulation system; and
    reconfiguring the emulation system via the runtime control program, wherein any of the plurality of regular signal wires having a fault are reassigned to one or more predefined spare signal wires.

14. The computer-readable program of claim 13, wherein the computer-readable program further includes the step of:
    performing a connectivity diagnostic on the set of emulation cables within the hardware emulator.

15. The computer-readable program of claim 13, wherein the method further includes the step of:

predefining one or more spare signal wires within the emulation cables at simulation model build time.

16. The computer-readable program of claim 13, wherein the step of reassigning signals from the set of faulty signal wires to one or more predefined spare signal wires within the set of emulation cables includes the steps of:

determining if a spare signal wire is available, if one or more faulty signal wires exist;

setting a source module spare register to a value corresponding to the source emulation processor having the faulty wire; and changing any receiving emulation processor steps sourced by the faulty wire to the spare wire.

* * * * *